US008654831B2

(12) United States Patent
Kitano

(10) Patent No.: US 8,654,831 B2
(45) Date of Patent: Feb. 18, 2014

(54) SIGNAL DETECTION APPARATUS

(75) Inventor: Toyokazu Kitano, Osaka (JP)

(73) Assignee: Daihen Corporation, Osaka (JP)

( * ) Notice: Subject to any disclaimer, the term of this patent is extended or adjusted under 35 U.S.C. 154(b) by 305 days.

(21) Appl. No.: 13/237,182

(22) Filed: Sep. 20, 2011

(65) Prior Publication Data

US 2012/0076245 A1    Mar. 29, 2012

(30) Foreign Application Priority Data

Sep. 28, 2010 (JP) ................................. 2010-216785
Jul. 19, 2011 (JP) ................................. 2011-157657

(51) Int. Cl.
*H03H 7/30*  (2006.01)
*H03H 7/40*  (2006.01)
*H03K 5/159* (2006.01)

(52) U.S. Cl.
USPC ........... 375/235; 375/232; 375/233; 375/350; 375/340; 375/285; 708/322; 708/323; 455/296; 455/303; 455/306; 455/307

(58) Field of Classification Search
USPC ......... 375/235, 232, 233, 350, 340, 284, 285; 408/322, 323; 455/296, 303, 306, 307
See application file for complete search history.

(56) References Cited

U.S. PATENT DOCUMENTS

| 6,980,609 B1* | 12/2005 | Ahn ............................. 375/343 |
| 2007/0276892 A1* | 11/2007 | Yomo et al. ................... 708/301 |
| 2013/0243135 A1* | 9/2013 | Row et al. ..................... 375/350 |

FOREIGN PATENT DOCUMENTS

JP    2000-116148    4/2000

* cited by examiner

*Primary Examiner* — Phuong Phu
(74) *Attorney, Agent, or Firm* — Hamre, Schumann, Mueller & Larson, P.C.

(57) ABSTRACT

A signal detection apparatus detects the frequency of an input signal without using a PLL. The detection apparatus includes a first and a second orthogonalizer, a phase difference calculator and an integrator, to control the variable coefficient $a_1$ of a band-pass filter. Information $e[k]=M\cdot\sin(\phi)$ representing the phase difference $\phi$ between the input data $x[k]$ and the output data $y[k]$ is calculated with the first and second orthogonalizers and the phase difference calculator. The sign of $e[k]$ is inverted and a predetermined integral calculation is performed with the integrator, and the calculated integral value is set as the coefficient $a_1$ of the band-pass filter. Every time input data $x[k]$ is input, the coefficient $a_1$ is changed by reducing it when $e[k]>0$ and increasing it when $e[k]<0$. Thus, the frequency of the output signal of the band-pass filter is matched to the input signal.

8 Claims, 8 Drawing Sheets

SIGNAL DETECTION APPARATUS

BACKGROUND OF THE INVENTION

1. Field of the Invention

The present invention relates to a signal detection apparatus that can accurately detect signals whose frequency is unknown or changes over time.

2. Description of Related Art

Conventionally, distributed power sources are known as systems that supply power to electric systems. Ordinarily, in distributed power sources, the phase of an AC voltage signal or an AC current signal of the electric system ("system signal") is detected, and this phase is fed back to the distributed power source. Thus, a control can be performed, by which the phase of the AC signal that is output from the distributed power source is matched to the phase of the system signal.

Since it is required that the distributed power source matches the phase of the output signal quickly and with high precision to the phase of the system signal, several circuits have been conventionally suggested for detecting the system signal. For example, in JP2000-116148A, a signal detection circuit is proposed, in which a phase voltage signal of a three-phase electric system is detected, this phase voltage signal is converted into a phase voltage signal of the positive phase part of each phase by a symmetric coordinate conversion circuit, and after normalization with a normalization circuit, a voltage signal is generated and output by a PLL (Phase-Locked Loop) circuit, that is synchronized only with the positive phase part of the phase voltage signal.

The signal detection method of JP 2000-116148A is referred to as "PLL method". The PLL method (1) generates an AC signal from a signal generator with variable phase, feeds back this AC signal to the input signal and calculates the phase shift between the two signals as a control signal, (2) synchronizes the phase of the AC signal to the input signal with this control signal by changing the phase of the AC signal generated by the signal generator in a direction that reduces the phase shift, thereby outputting a signal that is the same as the input signal. Consequently, since a detection circuit using this PLL method requires a signal generator and a circuit for the feedback control of the phase of the output signal of this signal generator (a circuit such as a phase comparator or a loop filter), the circuit configuration becomes complicated. Also, in the phase detection circuit described in JP 2000-116148A, there is no configuration for eliminating the noise components that are included in the input signal, so that if the frequency of the input signal is unknown or changes over time, there is the problem that the input signal cannot be detected accurately.

SUMMARY OF THE INVENTION

It is an object of the present invention to provide a signal detection apparatus that is able to accurately detect an input signal without necessitating a signal generator such as with the PLL method.

In accordance with a first aspect of the present invention, a signal detection apparatus includes a band-pass filter made of a second-order IIR digital filter having a feedback calculation processing portion for performing a feedback calculation process that includes a process of multiplying a coefficient, the band-pass filter having phase characteristics that are negative in a frequency region larger than a center frequency, that are positive in a frequency region smaller than the center frequency, and that are zero at the center frequency, the center frequency changing when the coefficient changes; a first signal generator for generating, from an input signal that is input into the band-pass filter, an in-phase signal having the same phase as the input signal, and a quadrature phase signal having a phase that is orthogonal to the input signal; a second signal generator for generating, from an output signal that is output from the band-pass filter, an in-phase signal having the same phase as the output signal, and a quadrature phase signal having a phase that is orthogonal to the output signal; a phase difference information generator for generating information representing a phase difference between the input signal and the output signal, using the two signals generated by the first signal generator and the two signals generated by the second signal generator; a coefficient controller for calculating, based on the information representing the phase difference, a control value that sustains the coefficient when the phase difference is zero, that reduces the coefficient when the phase difference is positive and that increases the coefficient when the phase difference is negative, and setting the coefficient of the band-pass filter with this control value.

In accordance with a second aspect of the invention, in a signal detection apparatus according to the first aspect, if the input signal is expressed by a first cosine signal and the output signal of the band-pass filter is expressed by a second cosine signal whose phase leads that of the first cosine signal, then the first signal generator generates a cosine signal having the same phase as the first cosine signal and a sine signal having the same phase as the first cosine signal; the second signal generator generates a cosine signal having the same phase as the second cosine signal and a sine signal having the same phase as the second cosine signal; and the phase difference information generator calculates a value that can be expressed as $M \cdot \sin(\phi)$ as the information representing the phase difference, where M is a constant, and $\phi$ is the phase difference between the first cosine signal and the second cosine signal.

In accordance with a third aspect of the invention, in a signal detection apparatus according to the first or second aspect, the coefficient controller is constituted by an integral calculator that inverts the sign of the information representing the phase difference and performs a predetermined integral calculation, and sets the coefficient of the band-pass filter with the calculated value as the control value.

In accordance with a fourth aspect of the invention, in a signal detection apparatus according to the first or second aspect, the coefficient includes a trigonometric function of the center frequency of the band-pass filter, and the coefficient controller comprises an integral calculator for performing a predetermined integral calculation on the information representing the phase difference; and a coefficient calculator for calculating the coefficient, taking the integral value calculated by the integral calculator as the center frequency of the band-pass filter, and setting the coefficient of the band-pass filter to the calculated value as the control value.

In accordance with a fifth aspect of the invention, in a signal detection apparatus according to the first or second aspect, the coefficient includes a trigonometric function of the center frequency of the band-pass filter, and the coefficient controller comprises an integral calculator for performing a predetermined integral calculation on the information representing the phase difference; a coefficient storage for storing a plurality of coefficients calculated in advance for each of a plurality of frequencies into which a predetermined frequency change range is quantized; a frequency converter for converting the integral value calculated by the integral calculator into a quantized frequency; and a coefficient setting unit for reading out, from the coefficient storage, a coefficient corresponding to the frequency into which the frequency converter has converted the integral value, and setting the coefficient of the band-pass filter with the read out frequency as a control value.

In accordance with a sixth aspect of the invention, in a signal detection apparatus according to the fifth aspect, data of the frequency that is output from the frequency converter is output after passing it through a low-pass filter that calculates a moving average of a predetermined number of data points.

In accordance with a seventh aspect of the invention, in a signal detection apparatus according to the first or second aspect, the band-pass filter has the following transfer function (Hz)

$$H(z) = \frac{b_0 + b_1 \cdot z^1}{1 - a_1 \cdot z^{-1} - a_2 \cdot z^{-2}} \quad (1)$$

$$b_0 = 1 - r^2$$

$$b_1 = (r-1) \cdot 2r \cdot \cos(\theta_c) = (r-1) \cdot a_1$$

$$a_1 = 2r \cdot \cos(\theta_c)$$

$$a_2 = -r^2$$

r: parameter determining width of the pass-band and converging time $f_c$: center frequency of the pass-band $f_s$: sampling frequency, and the coefficient is the coefficient $a_1$ of the transfer function H(z).

In accordance with a eighth aspect of the invention, in a signal detection apparatus according to the first or second aspect, at least one second band-pass filter having the same transfer function as the band-pass filter is cascaded in front of the band-pass filter, and the coefficient controller also sets the coefficient of the second band-pass filter with the control value.

With the present invention, when an input signal whose phase is shifted from the center frequency of a band-pass filter is input into this band-pass filter, then an output signal whose phase is shifted from this input signal is output from the band-pass filter. For example, when input data $x[k]=A_1 \cdot \cos(\omega_n \cdot k)$ (where k is an index number representing discrete points in time) is input into the band-pass filter, then output data $y[k]=A_2 \cdot \cos(\omega_n \cdot k - \phi)$ (where $\phi$ is the phase shift between the input data and the output data) is output from the band-pass filter 2. The first signal generator generates in-phase data $x_r[k]=A_1 \cdot \cos\{\omega_n \cdot (k-1)\}$ that is in phase with the input data x[k] as well as quadrature phase data $x_i[k]=2A_1 \cdot \sin(\omega_n) \cdot \sin\{\omega_n \cdot (k-1)\}$, and the second signal generator generates in-phase data $y_r[k]=A_2 \cdot \cos\{\omega_n \cdot (k-1) - \phi\}$ that is in phase with the output data y[k] as well as quadrature phase data $y_i[k]=2A_2 \cdot \sin(\omega_n) \cdot \sin\{\omega_n \cdot (k-1) - \phi\}$.

Then, using the data $x_r[k]$, $x_i[k]$, $y_r[k]$, $y_i[k]$, the phase difference information generator calculates data e[k] representing the phase difference $\phi$, expressed by $2A_1 \cdot A_2 \cdot \sin(\omega_n) \cdot \sin(\phi)$, and based on this data e[k], the coefficient controller calculates a control value that sustains the coefficient when the phase difference $\phi$ is zero, reduces the coefficient when the phase difference $\phi$ is positive, and increases the coefficient when the phase difference $\phi$ is negative. For example, the sign of the data e[k] is inverted, an integral value is calculated by performing a predetermined integral calculation, and the coefficient determining the center frequency of the band-pass filter is set with this calculated value as the control value.

Since the transfer characteristics of the band-pass filter are changed by setting the coefficient, which determines the center frequency of the band-pass filter, with the control value, every time input data x[k] is input, the transfer characteristics of the band-pass filter 2 change. The transfer characteristics are changed such that the center frequency of the band-pass filter becomes the same as the frequency of the input signal, by reducing the coefficient when the phase difference $\phi$ is positive and increasing the coefficient when the phase difference $\phi$ is negative, that is, such that the phase difference $\phi$ becomes zero, and when the phase difference $\phi$ becomes zero, the transfer characteristics at that time are sustained, so that a signal with the same phase as that of the input signal is output from the band-pass filter.

Consequently, with the signal detection apparatus according to the present invention, it is possible to accurately detect an input signal of unknown frequency or an input signal whose frequency changes over time, without using a signal generator, such as a PLL.

DETAILED DESCRIPTION OF THE PREFERRED EMBODIMENTS

The following is a specific explanation of embodiments of the invention, with reference to the accompanying drawings.

A signal detection apparatus according to the present invention is suitable for detecting AC signals whose frequency is unknown (sinusoidal signal) or AC signals whose frequency changes over time. Examples of technical fields that necessitate the detection of such AC signals include high-frequency power supply systems for supplying high-frequency power to plasma processing apparatuses that process semiconductor substrates or liquid crystal substrates by etching or CVD (Chemical Vapor Deposition) as well as distributed power sources that supply power with interconnected power systems.

In such a high-frequency power supply system, the load impedance varies considerably due to the substrate processing, and an output control or accident-prevention control of the high-frequency power supply system is performed, in which the base frequency or harmonic frequencies of the AC voltage or AC current input into the load during substrate processing are detected, and this detection value is given as feedback to a high-frequency power source or an impedance matching device. Moreover, in a distributed power source, the base frequency or the harmonic frequencies of the voltage or current of the electric system are detected, a control is carried out in which this detection value is given as feedback to the distributed power source, and the phase of the output signal of an inverter that is build into the distributed power source is matched to the phase of the AC signal of the electric system.

Figure 1:
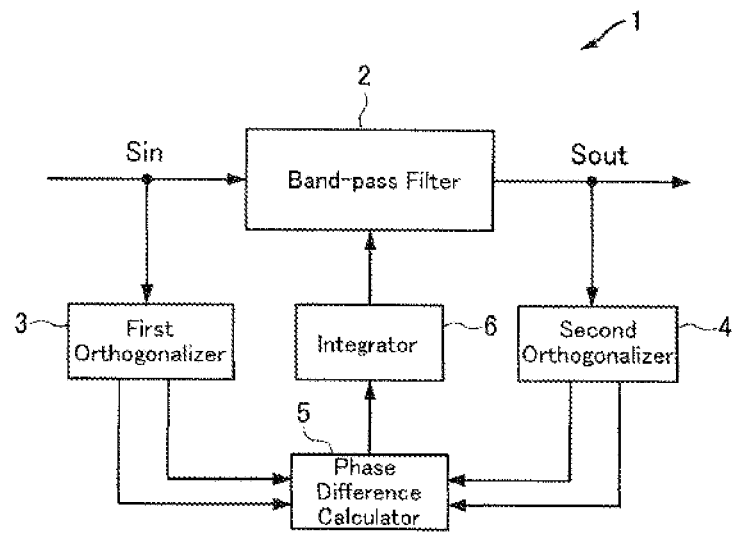
FIG. 1 is a block diagram showing the configuration of a first embodiment of a signal detection apparatus according to the present invention.
Figure 2:
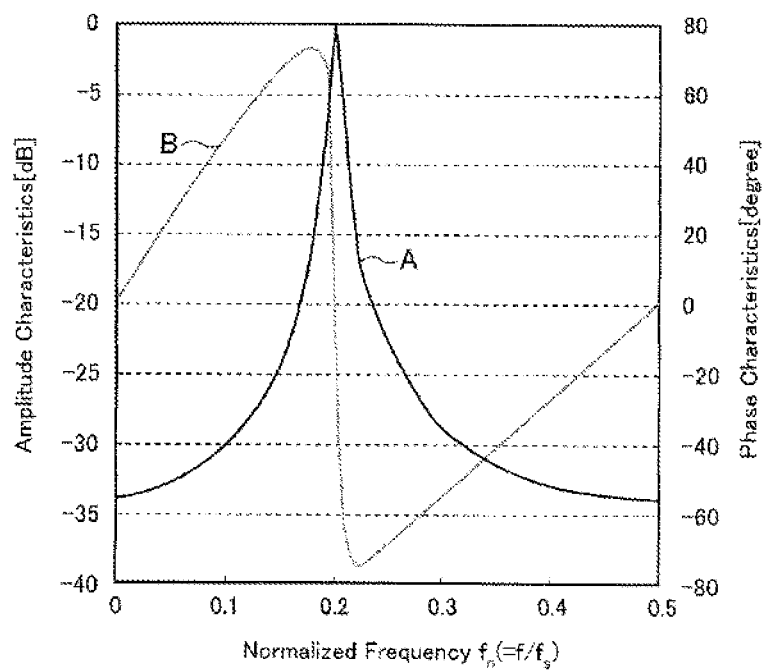
FIG. 2 is a diagram showing the frequency characteristics of the band-pass filter shown in FIG. 1.
Figure 3:
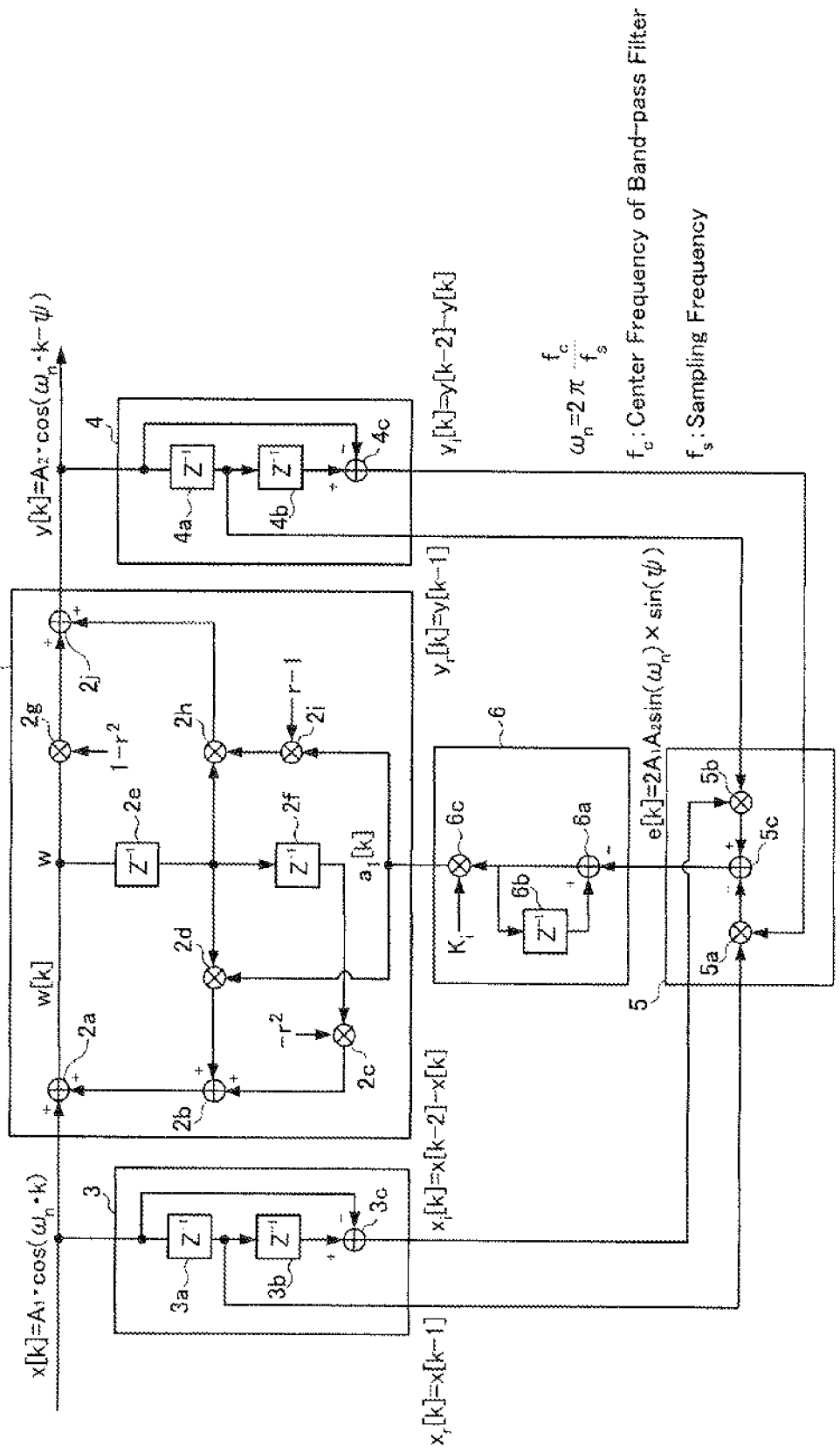
FIG. 3 is a diagram showing the constituent elements in the various processing blocks of the signal detection apparatus shown in FIG. 1.

FIG. 1 is a block diagram showing the configuration of a first embodiment of a signal detection apparatus according to the present invention. FIG. 2 is a diagram showing the frequency characteristics of a band-pass filter 2 included in the signal detection apparatus 1 shown in FIG. 1. FIG. 3 is a diagram showing the constituent elements in the various processing blocks of the signal detection apparatus 1 shown in FIG. 1.

The signal detection apparatus 1 includes a band-pass filter 2 that is constituted by an IIR (Infinite Impulse Response) digital filter including a feedback calculation processing portion and a feed-forward calculation processing portion. The signal detection apparatus 1 is characterized by a configuration that detects an input signal (sinusoidal signal) whose frequency is unknown or whose frequency changes over time, by changing the coefficient $a_1$ of the transfer function $H(z)$ (see Equation (1) below) of the band-pass filter 2.

The signal detection apparatus 1 calculates, by a digital calculation process, information representing the phase difference $\phi$ (where $\phi$ is the phase shift between the input signal $S_{in}$ and the output signal $S_{out}$) between the phase $\theta_{in}$ ($=2\pi f_{in} \cdot t$) (where $f_{in}$ is the frequency of the input signal $S_{in}$; referred to in the following as "input frequency") of the input signal $S_{in}$ and the phase ($\theta_{in}-\phi$) of the output signal $S_{out}$ of the band-pass filter 2, and performs a control that changes the coefficients $a_1$ of the transfer function $H(z)$ of the band-pass filter 2 such that this calculation value becomes "0". Through this control, the signal detection apparatus 1 outputs from the band-pass filter 2 a signal having precisely the same phase as the input signal $S_{in}$, matching the center frequency $f_c$ of the band-pass filter 2 to the input frequency $f_{in}$.

As processing blocks for calculating the information representing the phase difference $\phi$ between the input signal $S_{in}$ and the output signal $S_{out}$, the signal detection apparatus 1 is provided with a first orthogonalizer 3, a second orthogonalizer 4 and a phase difference calculator 5. The first orthogonalizer 3 generates from the input signal $S_{in}$ two orthogonal signals, namely a signal that is in phase with the input signal $S_{in}$ and a signal that is in quadrature phase to the input signal $S_{in}$ (phase delayed by 90° with respect to the input signal $S_{in}$). The second orthogonalizer 4 generates from the output signals $S_{out}$ two orthogonal signals, namely a signal that is in phase with the output signal $S_{out}$ and a signal that is in quadrature phase to the output signal $S_{out}$. In the following explanations, the in-phase signal that is generated by the first orthogonalizer 3 is referred to as "first in-phase signal" and the in-phase signal that is generated by the second orthogonalizer 4 is referred to as "second in-phase signal". Moreover, the quadrature signal that is generated by the first orthogonalizer 3 is referred to as "first quadrature signal" and the quadrature signal that is generated by the second orthogonalizer 4 is referred to as "second quadrature signal".

The phase difference calculator 5 calculates information (in the following, this information is referred to as "phase difference information") that represents the phase difference between the input signal $S_{in}$ and the output signal $S_{out}$ using the first in-phase signal and the first quadrature signal generated by the first orthogonalizer 3 and the second in-phase signal and the second quadrature signal generated by the second orthogonalizer 4.

The signal detection apparatus 1 includes an integrator 6 as a processing block for calculating the value to which the coefficient $a_1$ of the transfer function $H(z)$ of the band-pass filter 2 is to be set using the phase difference information calculated by the phase difference calculator 5, and setting the coefficient $a_1$ in the band-pass filter 2.

The signal detection apparatus 1 may be constituted by a microcomputer including a CPU (Central Processing Unit), a ROM (Read Only Memory) and a RAM (Random Access Memory). By executing a program loaded in advance on this microcomputer, the signal detection apparatus 1 can perform the calculation processes of the various function blocks of the band-pass filter 2, the first orthogonalizer 3, the second orthogonalizer 4, the phase difference calculator 5 and the integrator 6. It should be noted that the signal detection apparatus 1 may also be realized by an FPGA (Field Programmable Gate Array).

The band-pass filter 2 is constituted by a second-order IIR digital filter having a transfer function $H(z)$ of a discrete system as shown by Equation (1) below:

$$H(z) = \frac{b_0 + b_1 \cdot z^{-1}}{1 - a_1 \cdot z^{-1} - a_2 \cdot z^{-2}} \quad (1)$$

$$b_0 = 1 - r^2$$

$$b_1 = (r-1) \cdot 2r \cdot \cos(\theta_c) = (r-1) \cdot a_1$$

$$a_1 = 2r \cdot \cos(\theta_c)$$

$$a_2 = -r^2$$

r: parameter determining the width of the pass-band and the converging time (0<r<1)

$\theta_c$: $2\pi(f_c/f_s)$ $f_c$: center frequency of the pass-band (0<$f_c/f_s$<0.5)

$f_s$: sampling frequency

The amplitude characteristics $M(f)$ and the phase characteristics $\theta(f)$ of the transfer function $H(z)$ in Equation (1) can be expressed by the Equations (2) and (3) below:

$$M(f) = \sqrt{H\left(e^{\frac{j2\pi f}{f_c}}\right) \cdot H\left(e^{-\frac{j2\pi f}{f_c}}\right)} \quad (2)$$

$$= (1-r) \cdot \sqrt{\frac{(1+r)^2 + 4r^2 \cdot \cos^2\left(\frac{2\pi f_c}{f_s}\right) - 4r \cdot (1+r) \cdot \cos\left(\frac{2\pi f_c}{f_s}\right) \cdot \cos\left(\frac{2\pi f}{f_s}\right)}{\left[1 - 2r \cdot \cos\left\{\frac{2\pi(f_c - f)}{f_s}\right\} + r^2\right] \cdot \left[1 - 2r \cdot \cos\left\{\frac{2\pi(f_c + f)}{f_s}\right\} + r^2\right]}}$$

$$\theta(f) = \tan^{-1}\left[\text{Im}\{H(e^{i\frac{2\pi f}{f_s}})\}/\text{Re}\{H(e^{i\frac{2\pi f}{f_s}})\}\right] \quad (3)$$

$$= \tan^{-1}\left\{\frac{2r\cdot\cos\left(\frac{2\pi f_c}{f_s}\right)\cdot\sin\left(\frac{2\pi f}{f_s}\right)}{1+r-2r\cdot\cos\left(\frac{2\pi f_c}{f_s}\right)\cdot\cos\left(\frac{2\pi f}{f_s}\right)}\right\} +$$

$$\tan^{-1}\left[\frac{r\cdot\sin\left\{\frac{2\pi(f_c-f)}{f_s}\right\}}{1-r\cdot\cos\left\{\frac{2\pi(f_c-f)}{f_s}\right\}}\right] +$$

$$\tan^{-1}\left[\frac{-r\cdot\sin\left\{\frac{2\pi(f_c+f)}{f_s}\right\}}{1-r\cdot\cos\left\{\frac{2\pi(f_c+f)}{f_s}\right\}}\right]$$

From Equations (2) and (3), it can be seen that the center frequency of the band-pass filter 2 is "$f_c$". Consequently, the center frequency $f_c$ of the band-pass filter 2 can be changed by changing the coefficient $a_1$.

The band-pass filter 2 has the frequency characteristics shown in FIG. 2. The frequency characteristics shown in this figure show an example that is calculated for the case that the center frequency $f_c$ of the band-pass filter 2 is set to a frequency $f_c=0.2\times f_s$, where the normalized frequency $f_n$, ($=f/f_s$), which is the frequency $f$ normalized to the sampling frequency $f_s$, becomes 0.2, and the parameter r is set to "0.96". Note that the curve A represents the amplitude characteristics and the curve B represents the phase characteristics.

As shown in FIG. 2, the band-pass filter 2 has such phase characteristics that the phase becomes zero when the normalized frequency $f_n$ is 0.2, the phase takes on a negative value when $f_n>0.2$, and the phase takes on a positive value when $f_n<0.2$. That is to say, it has such phase characteristics that, when the input frequency $f_{in}$ is the same as the center frequency $f_c$ of the band-pass filter 2, then the output signal $S_{out}$ of the band-pass filter 2 has the same phase as the input signal $S_{in}$, in the region $f_{in}>f_c$, the phase is delayed (positive phase) and in the region $f_{in}<f_c$, the phase is leading (negative phase).

Consequently, if the state of the phase difference $\phi$ ($=\theta_{in}-\theta_{out}$) between the phase $\theta_{in}$ ($=2\pi f_{in}\cdot t$) of the input signal $S_{in}$ and the phase $\theta_{out}$ ($=2\pi f_{in}\cdot t-\phi$) of the output signal $S_{out}$ of the band-pass filter 2 is known, then it is possible to know the relative positional relationship between the center frequency $f_c$ of the band-pass filter 2 and the input frequency $f_{in}$ of the input signal $S_{in}$. If the relative positional relationship between the input frequency $f_{in}$ and the center frequency $f_c$ is known, then, by changing the coefficients $a_1$ of the transfer function H(z) of the band-pass filter 2 in accordance with the state of the phase difference $\phi$, it is possible to match the center frequency $f_c$ of the band-pass filter 2 to the input frequency $f_c$ of the input signal $S_{in}$. That is to say, if the phase difference $\phi$ is zero, then the coefficient $a_1$ is maintained, if $\phi>0$ (delayed phase), then the coefficient $a_1$ is reduced, and if $\phi<0$ (leading phase), then the coefficient $a_1$ is increased. Through this control, the center frequency $f_c$ of the band-pass filter 2 can be matched to the input frequency $f_{in}$ of the input signal $S_{in}$.

In this embodiment, since the (positive or negative) sign of $\phi$ matches the (positive or negative) sign of $\sin(\phi)$, $M\cdot\sin(\phi)$ (where M is a constant with $0<M$) is calculated as the information representing the phase difference $\phi$, and using this calculated value, the change value of the coefficient $a_1$ is set in accordance with the (positive or negative) sign of this calculated value. The first orthogonalizer 3, the second orthogonalizer 4 and the phase difference calculator 5 calculate the phase difference information represented by $M\cdot\sin(\phi)$, and the integrator 6 calculates a control value that changes the coefficient $a_1$ based on this phase change information.

Consequently, in the present embodiment, the coefficient $a_1$ of the transfer function H(z) shown in Equation 1 is set to the variables $a_1[k]$ (where k is an index number representing discrete points in time) in FIG. 3. The integrator 6 sets the variables $a_1[k]$ in the band-pass filter 2 every time a discrete value x[k] (digital data; referred to below as "input data x[k]") obtained by sampling the input signal $S_{in}$ input into the band-pass filter 2 at a sampling period $T_s$ ($=1/f_s$).

As shown in FIG. 3, the calculation process in the band-pass filter 2 is realized by a feedback calculation processing part constituted by adders 2a and 2b, multipliers 2c and 2d and delay elements 2e and 2f, and a feed-forward calculation processing part constituted by the delay element 2e, multipliers 2g, 2i and 2h and an adder 2j. The feedback calculation processing part is a portion that calculates the denominator in Equation (1), whereas the feed-forward calculation processing part is a portion that calculates the numerator in Equation (1).

In FIG. 3, when y[k] are the discrete values (digital data; referred to below as "output data") that are output from the band-pass filter 2, w[k] is the data at the node w, and $a_1$ is $a_1[k]$ at a given point in time, then:

$$w[k]=x[k]+a_1\cdot w[k-1]-r^2\cdot w[k-2]$$

$$y[k]=(1-r^2)\cdot w[k]+(1-r)\cdot a_1\cdot w[k-1]$$

Transformed into z, these two equations are:

$$W(z)=X(z)+a_1\cdot z^{-1}\cdot W(z)-r^2\cdot z^{-2}\cdot W(z)$$

$$Y(z)=(1-r^2)\cdot W(z)+(r-1)\cdot a_1\cdot z^{-1}\cdot W(z)$$

so that:

$$X(z)=(1-a_1\cdot z^{-1}+r^2\cdot z^{-2})\cdot W(z)$$

$$Y(z)=\{(1-r^2)+(r-1)\cdot a_1\cdot z^{-1}\}\cdot W(z)$$

Thus, $$H(z)=Y(z)/X(z)=\{(1-r^2)+(r-1)\cdot a_1\cdot z^{-1}\}/(1-a_1\cdot z^{-1}+r^2\cdot z^{-2}) \quad (4)$$

Comparing Equation (4) with Equation (1), since $b_0=(1-r^2)$, $b_1=(r-1)\cdot a_1$, and $a_2=-r^2$, FIG. 3 shows the calculation process of the transfer function H(z) shown in Equation (1).

Consequently, with the band-pass filter 2, every time the input data x[k] is input, the above Equation (1) is calculated and the calculated value is output as the output data y[k].

As shown in FIG. 3, the first orthogonalizer 3 and the second orthogonalizer 4 each include a portion that performs a calculation process with a transfer function $H_r(z)=z^{-1}$ and a calculation process with a transfer function $H_i(z)=z^{-2}-1$, and are 1-in 2-out calculators that output the calculation results of these calculation processing portions. The calculation processing portions with the transfer function $H_r(z)=z^{-1}$ (the portion of the delay element 3a in the first orthogonalizer 3, and the portion of the delay element 4a in the second orthogonalizer 4) are portions that output a signal that is in phase with the input signal. The calculation processing portions with the transfer function $H_i(z)=z^{-2}-1$ (the portion of the delay elements 3a and 3b and the adder 3c in the first orthogonalizer 3, and the portion of the delay elements 4a and 4b and the adder 4c in the second orthogonalizer 4) are portions that output a signal that is in quadrature phase with the input signal.

If the data that is input into the transfer function $H_r(z)$ is a cosine wave that is represented by $v[k]=V\cdot\cos(\omega\cdot k)$ (where $\omega=2\pi f$), then the data $u_r[k]$ that is output from the transfer function $H_r(z)$ is:

$$u_r[k]=v[k-1]=V\cdot\cos\{\omega\cdot(k-1)\} \qquad (5)$$

Therefore, a signal is output from the calculation processing portion with the transfer function $H_r(z)$ that has the same phase as the signal delayed by one sample period with respect to the input.

On the other hand, the data $u_i[k]$ that is output from the transfer function $H_i(z)$ is $u_i[k]=v[k-2]-v[k]=V\cdot[\cos\{\omega\cdot(k-2)\}-\cos(\omega\cdot k)]$. Since $\cos(\alpha)-\cos(\beta)=2\sin\{(\alpha+\beta)/2\}\cdot\sin\{(\alpha-\beta)/2\}$, the equation $\cos\{\omega\cdot(k-2)\}-\cos(\omega\cdot k)=2\sin(\omega)\cdot\sin\{\omega\cdot(k-1)\}$ holds, so that the data $u_i[k]$ that is output from the transfer function $H_i(z)$ is $$u_i[k]=2V\cdot\sin(\omega)\cdot\sin\{\omega\cdot(k-1)\} \qquad (6)$$

Consequently, a signal is output from the calculation processing portion with the transfer function $H_i(z)$ that in quadrature phase to the signal delayed by one sample period with respect to the input.

When the input data $x[k]$ that is input into the band-pass filter 2 and the output data $y[k]$ that is output from the band-pass filter 2 are expressed by $$x[k]=A_1\cdot\cos(2\pi\cdot f_n\cdot k)=A_1\cdot\cos(\omega_n\cdot k)$$

$$y[k]=A_2\cdot\cos(\omega_n\cdot k-\phi)$$

$$f_n=f_{in}/f_s$$

$$\omega_n=2\pi\cdot f_n$$

$A_1$, $A_2$: Amplitude ($A_1$, $A_2 > 0$)
then it follows from Equations (5) and (6) that the data (data of the first in-phase signal) $x_r[k]=x[k-1]=A_1\cdot\cos\{\omega_n\cdot(k-1)\}$ is output from the delay element 3a of the first orthogonalizer 3, and the data (data of the first quadrature signal) $x_i[k]=x[k-2]-x[k]=2A_1\cdot\sin(\omega_n)\cdot\sin\{\omega_n\cdot(k-1)\}$ is output from the adder 3c. Moreover, the data (data of the second in-phase signal) $y_r[k]=y[k-1]=A_2\cdot\cos\{\omega_n\cdot(k-1)-\phi\}$ is output from the delay element 4a of the second orthogonalizer 4, and the data (data of the second quadrature signal) $y_i[k]=y[k-2]-y[k]=2A_2\cdot\sin(\omega_n)\cdot\sin\{\omega_n\cdot(k-1)-\phi\}$ is output from the adder 4c.

As shown in FIG. 3, the phase difference calculator 5 calculates $e[k]=y_r[k]\cdot x_i[k]-x_r[k]\cdot y_i[k]$. The multiplier 5a performs the calculation $x_r[k]\cdot y_i[k]$, the multiplier 5b performs the calculation $y_r[k]\cdot x_i[k]$, and the adder 5c subtracts the multiplication result of the multiplier 5a from the multiplication result of the multiplier 5b.

The calculation values of the multipliers 5a and 5b are:

$$y_r[k]\cdot x_i[k]=A_2\cdot\cos[\omega_n\cdot(k-1)-\phi]\cdot 2A_1\cdot\sin(\omega_n)\cdot\sin[\omega_n\cdot(k-1)]=2A_1\cdot A_2\cdot\sin(\omega_n)\cdot\cos[\omega_n\cdot(k-1)-\phi]\cdot\sin[\omega_n\cdot(k-1)]$$

$$x_r[k]\cdot y_i[k]=A_1\cdot\cos[\omega_n\cdot(k-1)\cdot 2A_2\cdot\sin(\omega_n)\cdot\sin[\omega_n\cdot(k-1)-\phi]=2A_1\cdot A_2\cdot\sin(\omega_n)\cdot\cos[\omega_n\cdot(k-1)]\cdot\sin[\omega_n\cdot(k-1)-\phi]$$

If $2A_1\cdot A_2\cdot\sin(\omega_n)$ is defined as $2A_1\cdot A_2\cdot\sin(\omega_n)=M$ (constant), then $$y_r[k]\cdot x_i[k]=M\cdot\cos[\omega_n\cdot(k-1)-\phi]\cdot\sin[\omega_n\cdot(k-1)]$$

$$x_r[k]\cdot y_i[k]=M\cdot\cos[\omega_n\cdot k-1)]\cdot\sin[\omega_n\cdot(k-1)-\phi]$$

so that the calculation result $e[k]$ of the phase difference calculator 5 becomes $$e[k]=M\cdot[\cos[\omega_n\cdot(k-1)-\phi]\cdot\sin[\omega_n\cdot(k-1)]-\cos[\omega_n\cdot(k-1)]\cdot\sin[\omega_n\cdot(k-1)-\phi]]$$

Moreover, $\cos(\alpha)\cdot\sin(\beta)-\cos(\beta)\cdot\sin(\alpha)=\sin(\beta-\alpha)$ yields $$e[k]=M\cdot[\sin[\omega_n\cdot(k-1)-\omega_n\cdot(k-1)+\phi]]=M\cdot\sin(\phi) \qquad (7)$$

Since the amplitudes $A_1$ and $A_2$ are $0 < A_1$ and $0 < A_2$, and $0 < \omega_n < \pi$ follows from $0 < f_n < 0.5$, it follows that $0 < M$. Consequently, every time input data $x[k]$ is input into the band-pass filter 2, the phase difference calculator 5 calculates $M\cdot\sin(\phi)$, which serves as the above-noted information representing the phase difference $\phi$. The sign of this calculation value is inverted, and it is given into the integrator 6.

In the present embodiment, the first orthogonalizer 3 calculates a first in-phase signal that is in phase with the input signal $S_{in}$ of the band-pass filter 2 and a first quadrature signal that is in quadrature phase with the input signal $S_{in}$ and the second orthogonalizer 4 calculates a second in-phase signal that is in phase with the output signal $S_{out}$ of the band-pass filter 2 and a second quadrature signal that is in quadrature phase with the output signal $S_{out}$. Then, the value represented by $M\cdot\sin(\phi)$, which is obtained by subtracting the product of the first in-phase signal $x_r[k]$ and the second quadrature signal $y_i[k]$ from the product of the first quadrature signal $x_i[k]$ and the second in-phase signal $y_r[k]$ is taken as the information representing the phase difference $\phi$ between the input signal $S_{in}$ and the output signal $S_{out}$. Therefore, the phase difference calculator 5 calculating $M\cdot\sin(\phi)$ can be constituted by only two multipliers 5a, 5b and one adder 5c.

As a method for comparing the phases of sinusoidal signals, the methods of (a) multiplying the two signals and passing the result through a low-pass filter, (b) taking the average of the maximum and the minimum of the product of the two signals, and (c) measuring the time difference between the zero crossings of the two signals are known, for example. Method (a) has the disadvantages that a low-pass filter is necessary in addition to a multiplier and due to the low-pass filter, the response may be slow. Method (b) has the disadvantages that its precision is not very good, and its response is slow. Method (c) has the disadvantage that its precision is not very good. In contrast to these methods, the phase difference calculator 5 according to the present embodiment is constituted by only two multipliers 5a, 5b and one adder 5c, so that it has the advantage that information about the phase difference can be obtained with good precision and without a delay in response.

The integrator 6 integrates the data $-e[k]=-M\cdot\sin(\phi)$ input from the phase difference calculator 5 with its sign inverted, and is a calculator that calculates the update value $a_1[k]$ for the coefficient $a_1$ of the band-pass filter 2 by multiplying the integrated value with a predetermined gain $K_i$. In FIG. 3, the adder 6a and the delay element 6b are processing portions that perform a known integral calculation, and the multiplier 6c is a processing portion that multiplies this integrated value with the gain $K_i$.

As noted above, if $M\cdot\sin(\phi)=0$, then the center frequency $f_c$ of the band-pass filter 2 takes on the same state as the input frequency $f_{in}$, if $M\cdot\sin(\phi)>0$, then the center frequency $f_c$ of the band-pass filter 2 is smaller than the input frequency $f_{in}$, and if $M\cdot\sin(\phi)<0$, then the center frequency $f_c$ of the band-pass filter 2 is larger than the input frequency $f_{in}$. If $M\cdot\sin(\phi)>0$, and if a value that is larger than the present value of the coefficient $a_1$ is fed back for the coefficient $a_1$ of the band-pass filter 2, then it is possible to let $\theta_c=2\pi(f_c/f_s)$, which is included in the coefficient $a_1$ of the band-pass filter 2, converge to $\theta_{in}=2\pi(f_{in}/f_s)$. Conversely, if $M\cdot\sin(\phi)<0$, and if a value that is smaller than the present value of the coefficient $a_1$ of the band-pass filter 2 is fed back, then it is possible to let $\theta_c=2\pi(f_c/f_s)$, which is included in the coefficient $a_1$ of the band-pass filter 2, converge to $\theta_{in}$.

The value of $M \cdot \sin(\phi)$ expresses the shift between the center frequency $f_c$ of the band-pass filter 2 and the input frequency $f_{in}$, so that if the sign of $M \cdot \sin(\phi)$ is inverted and a control value is calculated with which integration control is performed, then it is possible to take this calculated value as the feedback control value for the coefficient $a_1$ of the transfer function H(z) of the band-pass filter 2. Consequently, after the integrator 6 integrates $-e[k]$, which is input from the phase difference calculator 5, it calculates the control value $a_1[k]$ by multiplying the result with the gain $K_i$, and sets the coefficient $a_1$ of the transfer function H(z) of the band-pass filter 2 is set to this calculated value $a_1[k]$. It should be noted that the control value $a_1[k]$ is $a_1[k]=2r \cdot \cos(\theta_c[k])$, $\theta_c[k]=2\pi(f_c[k]/f_s)$ (where $f_c[k]$ is the center frequency of the band-pass filter 2 at the time k.)

The following is an explanation of the operation of the signal detection apparatus 1 according to the present invention.

With the signal detection apparatus 1, when the input data $x[k]=A_1 \cdot \cos(\omega_n \cdot k)$ is input into the band-pass filter 2, then the output data $y[k]=A_2 \cdot \cos(\omega_n \cdot k-\phi)$ is output from the band-pass filter 2. The data $e[k]=M \cdot \sin(\phi)=2A_1 \cdot A_2 \cdot \sin(\omega_n) \cdot \sin(\phi)$, which represents the phase difference $\phi$ between the input signal $S_{in}$ and the output signal $S_{out}$, is calculated with the first orthogonalizer 3, the second orthogonalizer 4 and the phase difference calculator 5. Using this data $e[k]$, the integrator 6 calculates the control value $a_1[k]$, to which the coefficient $a_1$ of the transfer function H(z) of the band-pass filter 2 is updated. The coefficient $a_1$ of the band-pass filter 2 is set to this control value $a_1[k]$, changing the characteristics of the transfer function H(z) of the band-pass filter 2 shown in the above Equation (1) in the calculation process of the output data $y[k+1]$ for the next input data $y[k+1]$. From then on, every time the input data $x[k]$ (k=2, 3, ... ) is input, the coefficient $a_1$ of the transfer function H(z) of the band-pass filter 2 is changed to the control value $a_1[k]=2r \cdot \cos(2\pi(f_c[k]/f_s))$ (k=2, 3, ...), and the process of calculating the output data $y[k]$ (k=2, 3, ... ) is carried out.

Every time the input data $x[k]$ is input, the coefficient $a_1$ of the transfer function H(z) of the band-pass filter 2 is updated to $a_1[k]=2r \cdot \cos\{2\pi(f_c[k]/f_s)\}$, and this control value $a_1[k]$ changes such that the phase difference $\phi$ approaches zero. Then, when the phase difference $\phi$ becomes zero, $a_1[k]$ is maintained at $a_1[k]=2r \cdot \cos\{2\pi(f_{in}/f_s)\}$, so that the coefficient $a_1$ of the transfer function H(z) of the band-pass filter 2 converges to $2r \cdot \cos\{2\pi(f_{in}/f_s)\}$. Thus, the center frequency $f_c$ of the band-pass filter 2 is updated to the input frequency $f_{in}$ of the input signal $S_{in}$, and an output signal $S_{out}$ having the same phase as the input signal $S_{in}$ is output from the band-pass filter 2.

Consequently, with the signal detection apparatus 1 according to the present embodiment, it is possible to accurately detect an input signal $S_{in}$ with unknown frequency or an input signal $S_{in}$ whose frequency changes over time, without necessitating a signal generator, such as a PLL.

The following is an explanation of a second embodiment of a signal detection apparatus according to the present invention.

Figure 4:
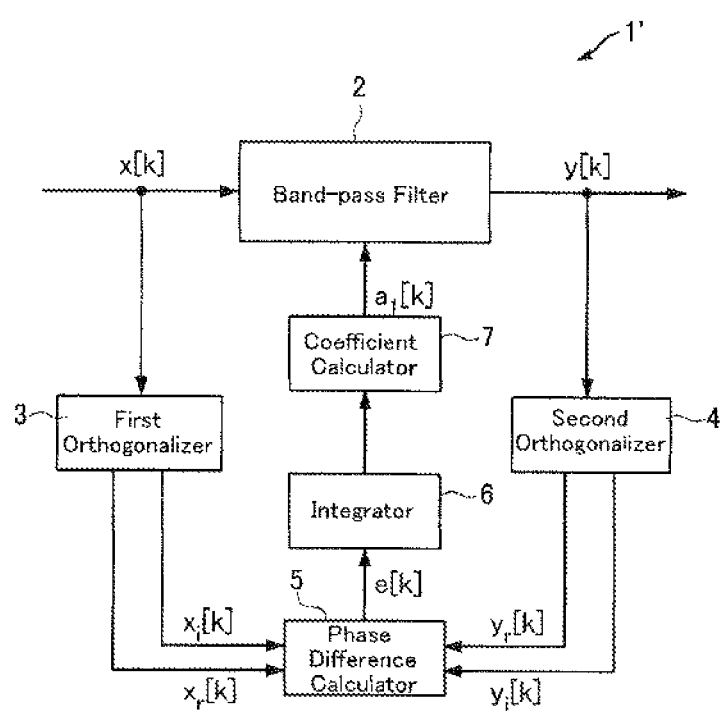
FIG. 4 is a block diagram illustrating a second embodiment of a signal detection apparatus according to the present invention.
Figure 5:
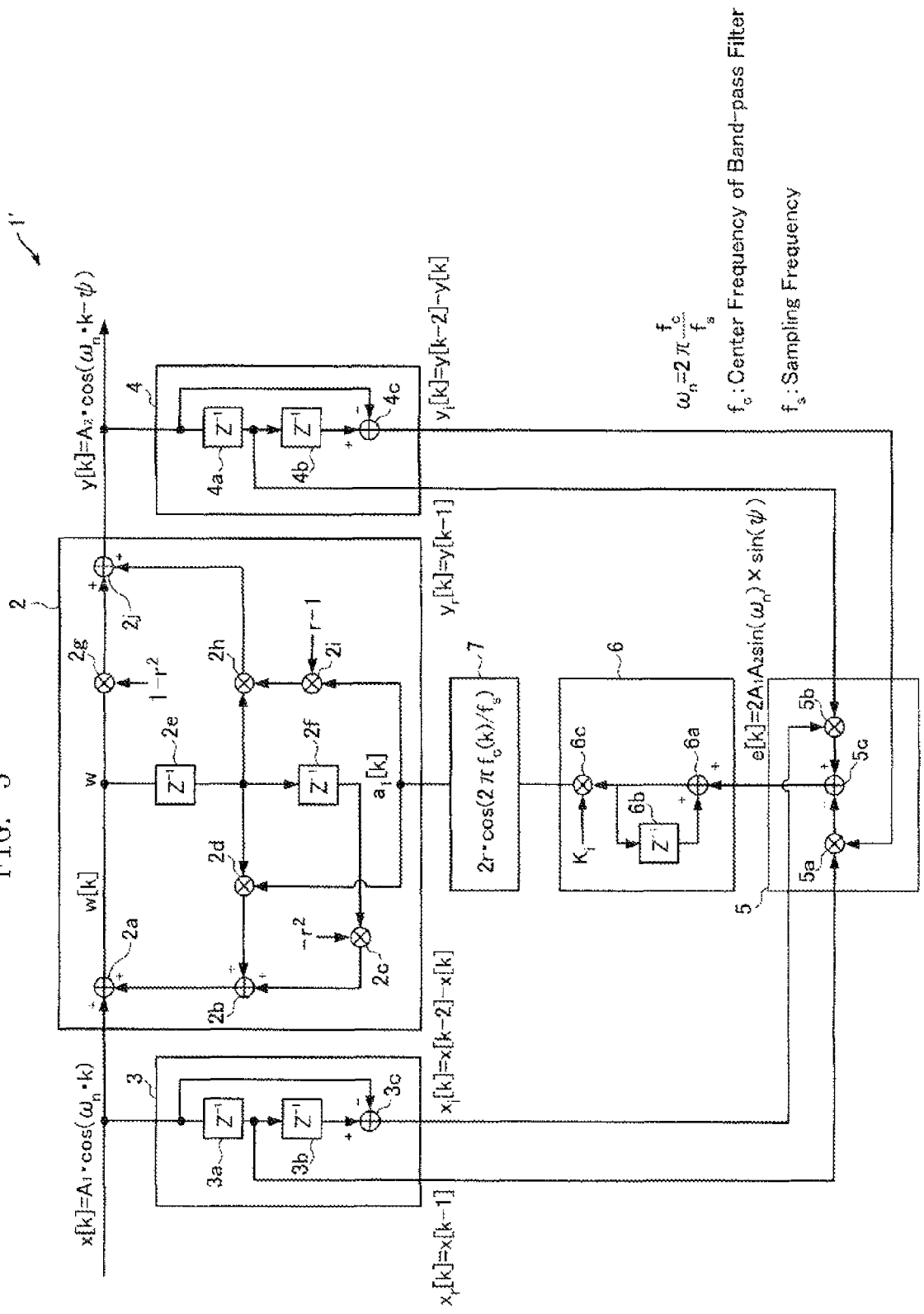
FIG. 5 is a diagram showing the constituent elements included in each of the processing blocks of the signal detection apparatus shown in FIG. 4.

FIG. 4 is a block diagram illustrating a second embodiment of a signal detection apparatus according to the present invention. FIG. 5 is a diagram showing the constituent elements included in each of the processing blocks of the signal detection apparatus 1' shown in FIG. 4.

In the first embodiment, a control value $a_1[k]$ for the coefficient $a_1$ of the band-pass filter 2 was generated using the calculated value $e[k]$ of the phase difference calculator 5, whereas in the second embodiment, a control value $f[k]$ of the center frequency $f_c$ of the band-pass filter 2 is generated using the calculation value $e[k]$ of the phase difference calculator 5, and furthermore, the control value $a_1[k]$ for the coefficient $a_1$ of the band-pass filter 2 is generated using this control value $f[k]$.

In the first embodiment, based on the value $e[k]=M \cdot \sin(\phi)$ calculated with the first orthogonalizer 3, the second orthogonalizer 4 and the phase difference calculator 5, it was determined whether $\phi<0$, $\phi>0$ or $\phi=0$, and depending on the result of this determination, a control value $a_1[k]$ was calculated from $e[k]$ that increases or decreases the coefficient $a_1$ from $e[k]$. That is to say, a control value $a_1[k]$ was generated by inverting the sign of $e[k]=M \cdot \sin(\phi)$ with the integrator 6 and multiplying the integral with the gain $K_i$, so that the coefficient $a_1$ is decreased if $M \cdot \sin(\phi)>0$, and the coefficient $a_1$ is increased if $M \cdot \sin(\phi)<0$.

In the second embodiment, the center frequency $f_c$ of the coefficient $a_1=2r \cdot \cos\{2\pi(f_c/f_s)\}$ is taken as a variable $f_x$ to be controlled, and the value $e[k]$ calculated with the first orthogonalizer 3, the second orthogonalizer 4 and the phase difference calculator 5 is utilized as a control value that increases or decreases the frequency $f_x$ of the coefficient $a_1=2r \cdot \cos\{2\pi(f_c[k]/f_s)\}$. In the second embodiment, by increasing or decreasing the frequency $f_x$ within the coefficient $a_1$ with the control value $f[k]$ generated with $e[k]$, the value of the coefficient $a_1$ is increased or increased, converging to the coefficient $a_1$ for which the phase difference $\phi$ becomes zero.

The second embodiment differs from the first embodiment in that it includes a processing block that calculates an integrated value from the value $e[k]=M \cdot \sin(\phi)$ calculated by the phase difference calculator 5, and calculates the control value $a_1[k]$ for the coefficient $a_1$ by inserting this integrated value into the $f_x$ of coefficient $a_1=2r \cdot \cos\{2\pi(f_x/f_s)\}$.

The signal detection apparatus 1' according to the second embodiment shown in FIGS. 4 and 5 differs from the signal detection apparatus 1 according to the first embodiment shown in FIGS. 1 and 3 in that between the integrator 6 and the band-pass filter 2, a coefficient calculator 7 is added that calculates the control value $a_1[k]$ for the coefficient $a_1$ by inserting the calculation result $s[k]$ of the integrator 6 into the frequency $f_x$ of coefficient $a_1=2r \cdot \cos\{2\pi(f_x/f_s)\}$.

In the second embodiment, when $M \cdot \sin(\phi)>0$, then the frequency $f_x$ needs to be decreased in order to decrease the coefficient $a_1$, when $M \cdot \sin(\phi)<0$, then the frequency $f_x$ needs to be increased in order to increase the coefficient $a_1$, so that the integrator 6 multiplies the integration result with the gain $K_i$ without inverting the sign of the calculation value $e[k]$ of the phase difference calculator 5. More specifically, the calculation value $e[k]$ of the phase difference calculator 5 is inserted into the adder 6a without inverting its sign.

With the signal detection apparatus 1' shown in FIG. 5, $e[k]=M \cdot \sin(\phi)$ is calculated in a similar manner to the signal detection apparatus 1 shown in FIG. 3 by the first orthogonalizer 3, the second orthogonalizer 4 and the phase difference calculator 5. Then, after $e[k]$ has been integrated with the integrator 6, it is multiplied with the gain $K_i$ to calculate the control value $f[k]$. Furthermore, the control value $a_1[k]=2r \cdot \cos\{2\pi(f[k]/f_s)\}$ is calculated with the coefficient calculator 7 using this control value $f[k]$, and the coefficient $a_1$ of the feedback calculation procession portion of the band-pass filter 2 is set to this control value $a_1[k]$.

As in the first embodiment, also in the second embodiment, every time the input data $x[k]$ is input, the coefficient $a_1$ of the transfer function H(z) of the band-pass filter 2 is changed such the phase difference $\phi$ approaches zero, and when the phase difference $\phi$ becomes zero, the coefficient $a_1$ at that time is sustained. Consequently, also in the second embodiment, the center frequency $f_c$ of the band-pass filter 2 is changed to the input frequency $f_{in}$ of the input signal $S_{in}$, and an output signal $S_{out}$ having the same phase as the input signal $S_{in}$ can be output from the band-pass filter 2.

As in the first embodiment, also in the second embodiment, no signal generator, such as a PLL, is required, and it is possible to accurately extract input signals $S_{in}$ whose frequency is unknown or input signals $S_{in}$ whose frequency changes with time. Moreover, in the second embodiment, the same frequency f indicating the center frequency $f_c$ included in the coefficient $a_1$ of the transfer function H(z) of the band-pass filter 2 is directly controlled, so that the coefficient $a_1$ converges to a the value where the phase difference $\phi=0$, so that there is the advantage that also the information on the frequency of the input signal $S_{in}$ can be obtained.

The following is an explanation of a third embodiment of a signal detection apparatus according to the present invention.

The above-described first embodiment has a configuration in which the sign of the value e[k] calculated by the phase difference calculator 5 is inverted, the value obtained by integration with the integrator 6 is taken as the control value $a_1[k]$ for the coefficient $a_1$ of the band-pass filter 2, and directly set as the coefficient $a_1$ of the band-pass filter 2. On the other hand, the above-described second embodiment has a configuration in which the value obtained by integrating with the integrator 6 the value e[k] calculated with the phase difference calculator 5 is taken as a control value f[k] of the center frequency $f_c$ of the band-pass filter 2, and after calculating the control value $a_1[k]$ for the coefficient $a_1$ with the coefficient calculator 7 using this control value f[k], this control value $a_1[k]$ is set as the coefficient $a_1$ of the band-pass filter 2.

In the first and the second embodiment, it is necessary to perform the calculation $$f_{in}=(f_s/2\pi)\cdot\cos^{-1}[a_1[k]/(2r)] \tag{8}$$

in order to determine the frequency $f_{in}$ of the input signal $S_{in}$ from the coefficients $a_1[k]$ of the band-pass filter 2, after the center frequency $f_c$ of the band-pass filter 2 has converged to the frequency $f_{in}$ of the input signal $S_{in}$. In the second embodiment, the integral value calculated by the integrator 6 is taken as the center frequency $f_c$ of the band-pass filter 2, so that it is possible to calculate the frequency $f_{in}$ of the input signal also with the calculation $$f_{in}=2r\cdot\cos[2\pi\cdot f_c[k]/(f_s)] \tag{9}$$

The coefficient $a_1[k]$ of the band-pass filter 2 is expressed by a trigonometric function, taking the center frequency $f_c$ as a variable, and the first and second embodiments are based on the idea of changing the coefficient $a_1[k]$ of the band-pass filter 2 in accordance with the value e[k] calculated with the phase difference calculator 5. Therefore, as noted above, when determining the frequency $f_{in}$ of the input signal $S_{in}$ with the first or second embodiment, a calculation processing circuit for inverse trigonometric functions or trigonometric functions becomes necessary. If the phase detection apparatus 1 or 1' is provided with a calculation processing circuit for inverse trigonometric functions or trigonometric functions, then the problem may occur that the maximum operation frequency of the band-pass filter 2 is lowered. Moreover, if the calculation processing circuit for inverse trigonometric functions or trigonometric functions is constituted by a logical circuit, such as an FPGA, then there is the problem that the scale of the circuit becomes large, and if it is constituted by a CPU, then there is the problem that the scale of the program executed on the CPU becomes large.

The third embodiment has a configuration in which it is possible to determine the frequency $f_{in}$ of the input signal $S_{in}$ without providing a calculation processing circuit for inverse trigonometric functions or trigonometric functions. As shown by the dashed line in FIG. 6, the first and second embodiment are based on the idea of changing the center frequency $f_c$ of the band-pass filter 2 to an arbitrary frequency in accordance with the value e[k] calculated with the phase difference calculator 5, to let it converge to the frequency $f_{in}$ of the input signal $S_{in}$. By contrast, as shown by the solid lines in the same drawing, the third embodiment is based on the idea of setting, in advance, ranges in which the center frequency $f_c$ of the band-pass filter 2 changes, setting the different values of the frequency within the range $f_{cmin}$ to $f_{cmax}$ over which the center frequency changes to N discrete values $f_{cj}=f_{cmin}+j\cdot(f_{cmax}-f_{cmin})/N$ (where j is the number of the separation range within the range over which the center frequency changes), and changing the center frequency $f_c$ of the band-pass filter 2 to the discrete frequency values $f_{cj}$ in accordance with the value e[k] calculated by the phase change calculator 5, converging to the frequency $f_{in}$ of the input signal.

Figure 6:
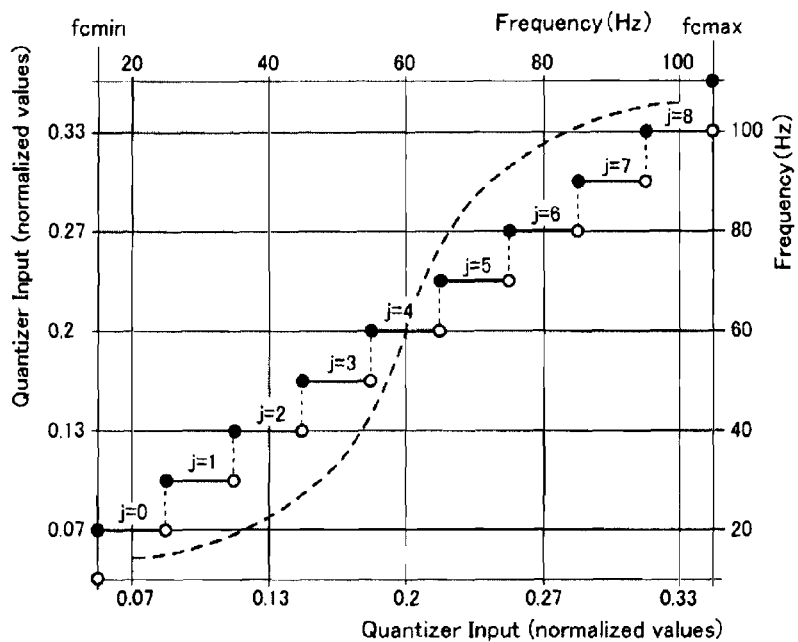
FIG. 6 is a diagram illustrating the quantization of the frequency with a quantizer.

In the example in FIG. 6, $f_d=(f_c/f_s)=0.05\sim0.35$ is taken as the range $f_{cmin}\sim f_{cmax}$ over which the center frequency changes. If $f_c=60$ Hz and $f_s=300$ Hz, then $f_{cmin}=15$ Hz and $f_{cmax}=105$ Hz. In FIG. 6, the number N of divisions is set to 9 due to illustrational reasons, but the actual number N of divisions can be set to a suitable value in view of the detection precision (the frequency resolution). For example, if the frequency resolution is 1 Hz, then the number N of divisions may be set to 90.

The third embodiment has a configuration in which N coefficients $a_{1j}$ corresponding to the frequencies $f_{cj}$ are stored in advance in a memory, the integral value calculated by the integrator 6 is quantized to one of the N frequencies $f_{cj}$, and the coefficient $a_1$ of the band-pass filter 2 is set by reading out the coefficients $a_{1j}$ corresponding to the quantized frequency $f_{cj}$ from the memory.

Figure 7:
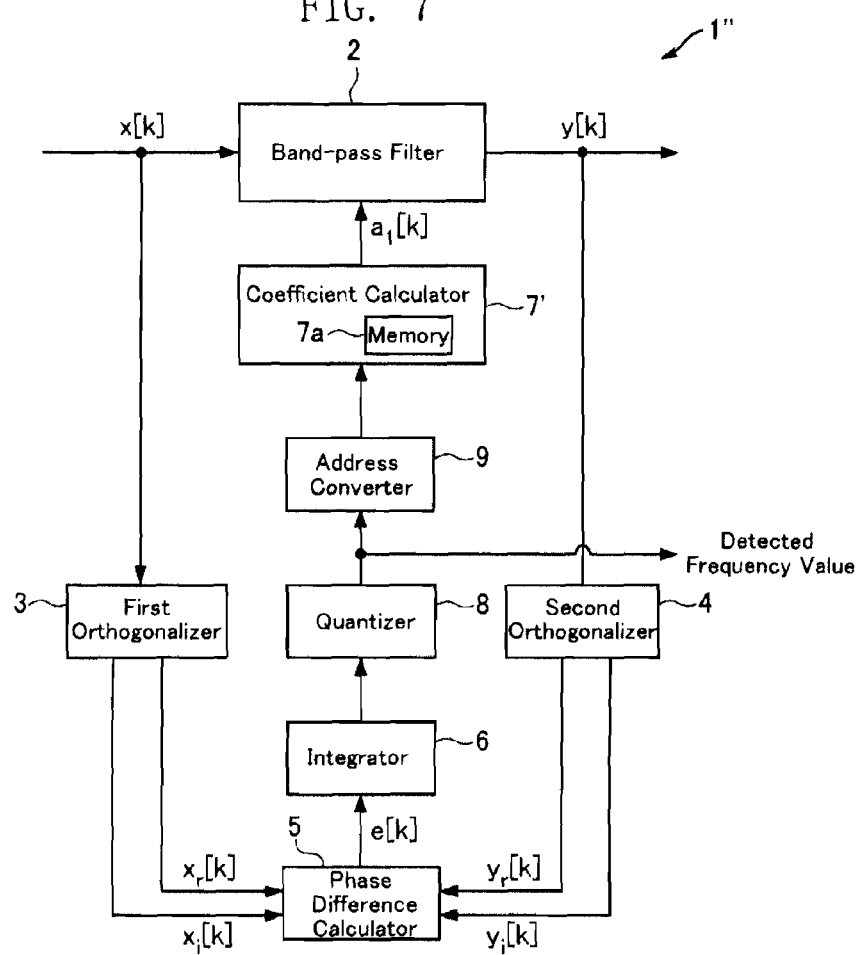
FIG. 7 is a block diagram showing the configuration of a third embodiment of the signal detection apparatus according to the present invention.

FIG. 7 is a block diagram showing the configuration of the third embodiment of the signal detection apparatus according to the present invention.

FIG. 7 differs from the signal detection apparatus 1' shown in FIG. 4 in that the coefficient calculator 7 is changed to a quantizer 8, an address converter 9 and a coefficient calculator 7'. The coefficient calculator 7' includes a memory 7a storing the N coefficients $a_{1j}$ corresponding to the above-noted frequencies $f_{cj}$. The coefficients $a_{1j}$ (j=0, 1, 2, . . . , N−1) are calculated in advance with the calculation equations $$a_{1j}=2r\cdot\cos[2\pi(f_{cj}-f_{cmin})]$$

$$f_{cj}=f_{cmin}+j\cdot(f_{cmax}-f_{cmin})/N \tag{10}$$

Every time an address $AD_j$ is input from the address converter 9, the coefficient calculator 7' reads the coefficient $a_{1j}$ stored at the address $AD_j$ from the memory 7a, and sets the coefficient $a_1$, of the band-pass filter 2 to this value.

The quantizer 8 quantizes the integration control value that is output from the integrator 6 (the value obtained by integrating the output $e[k]=M\cdot\sin(\phi)$ of the phase difference calculator 5 and multiplying the result with the gain $K_i$), to one of the N frequencies $f_{cj}$. If the integration control value that is output from the integrator 6 is taken as E[k] and the frequency resolution is taken to be $B=(f_{cmax}-f_{cmin})/N$, then, by performing the calculations $$f_{cj}[k]=B\cdot[\text{round}[E[k]/B]]$$

$$j=\text{round}[E[k]/B]-2 \tag{11}$$

the quantizer 8 calculates the quantized values $f_{cj}[k]$ of the integration control value $E[k]$. It should be noted that in Equation (11), round (x) is the ROUND function, which rounds the argument x to the specified number of decimal places.

In the example in FIG. 6, $B=(f_{cmax}-f_{cmin})/N=90/9=10$ Hz, so that for example if $E[k]=42$, then round $[E[k]/B]=4$, $j=2$, so that the quantized value of $f_{c2}[k]=40$ Hz is calculated by the quantizer 8.

The address converter 9 converts the quantized value $f_{cj}[k]$ calculated by the quantizer 8 into the address $AD_j$ where the coefficient corresponding to that quantization value $f_{cj}[k]$ is stored in the memory 7a. The address $AD_j$ converted by the address converter 9 is input into the coefficient calculator 7'.

With the signal detection apparatus 1" according to the third embodiment, every time the input data $x[k]=A_1 \cdot \cos(\omega_n \cdot k)$ is input into the band-pass filter 2, the phase difference calculator 5 calculates the data $e[k]=M \cdot \sin(\phi)=2A_1 \cdot A_2 \cdot \sin(\omega_n) \cdot \sin(\phi)$, which represents the phase difference $\phi$ between the input signal $S_{in}$ and the output signal $S_{out}$, and after integrating this data $e[k]$ with the integrator 6 and multiplying it with the gain $K_i$, the control value $f_c'$ of the center frequency of the band-pass filter 2 is calculated. Moreover, the quantizer 8 quantizes this control value $f_c'$ of the center frequency into a preset frequency $f_{cj}$, the address converter 9 converts the quantized frequency $f_{cj}$ into the address $AD_j$, and inputs it into the coefficient calculator 7'. Then, the coefficient calculator 7' reads out the coefficient $a_{1j}$ that is stored in the address $AD_j$ of the memory 7a, and sets the coefficient $a_1$ of the band-pass filter 2 to the coefficient $a_1[k+1]$ for the next input data $x[k+1]$.

Consequently, the characteristics of the transfer function $H(z)$ of the band-pass filter 2 represented by Equation (1) are changed by the calculation process of the output data $y[k+1]$ for the next input data $x[k+1]$. Thereafter, every time input data $x[k]$ ($k=2, 3, \ldots$) are input, the coefficient $a_1$ of the band-pass filter 2 is changed to the control value $a_1[k]$ ($k=2, 3, \ldots$), and a process for calculation of the output data $y[k]$ ($k=2, 3, \ldots$) is performed.

Every time the input data $x[k]$ is input, the coefficient $a_1$ of the band-pass filter 2 changes the preset coefficient $a_1[k]$ in a stepwise manner, such that the phase difference $\phi$ approaches zero. Then, when the center frequency $f_{cj}$ of the band-pass filter 2 converges to the same division range as the input frequency $f_{in}$, the coefficient $a_1$ of the band-pass filter 2 is sustained at the coefficient $a_{1j}$ corresponding to that center frequency $f_{cj}$. Consequently, an output signal $S_{out}$ whose phase difference to the input signal $S_{in}$ is substantially zero is output from the band-pass filter 2.

With the third embodiment, the frequency $f_{in}$ when the center frequency $f_c$ of the band-pass filter 2 converges is obtained through the frequency $f_{cj}$, which is obtained by quantizing the output of the integrator 6, so that it is possible to obtain the frequency $f_{in}$ of the input signal from the output of the integrator 6 without calculating an inverse trigonometric function or a trigonometric function as in the first and second embodiments.

In the third embodiment, the center frequency $f_{cj}$ of the band-pass filter 2 converges to the same divisional range as that of the input frequency $f_{in}$, so that there is a frequency error $\Delta f$ between the converged center frequency $f_{cj}$ and the input frequency $f_{in}$. If the number of divisions N of the center frequency change range is made large, that is, if the frequency resolution B is made small, this frequency error $\Delta f$ can be decreased and the detection accuracy of the input frequency $f_{in}$ can be increased. However, if the frequency resolution B is made small, then the number of coefficients $a_{1j}$ stored in the memory 7a increases accordingly, to that there is the problem that the necessary capacity of the memory 7a increases as well.

Figure 8:
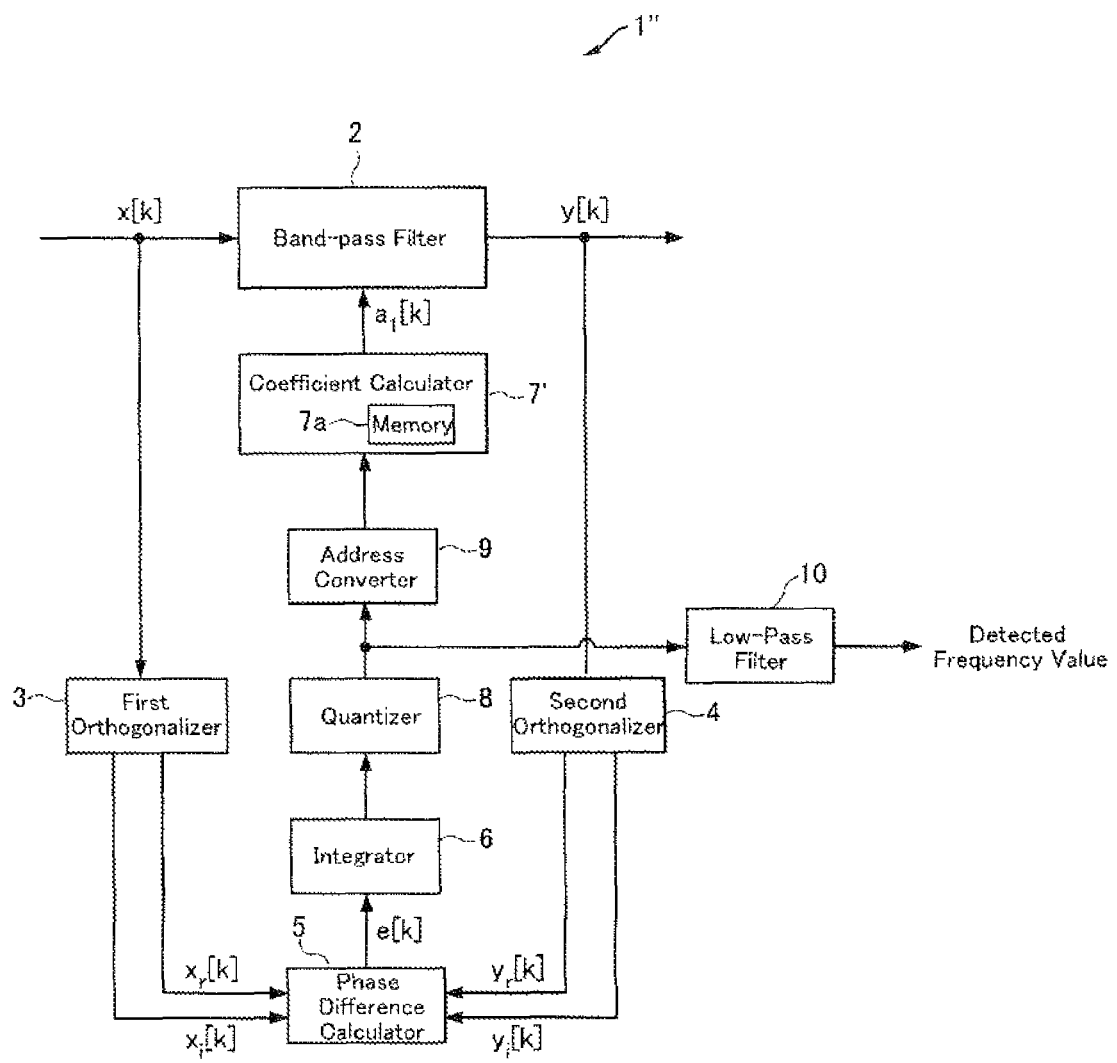
FIG. 8 is a block diagram showing a modified example of a signal detection apparatus according to a third embodiment, in which the quantization number of the quantizer is reduced.

It is possible to counter this problem by providing a low-pass filter 10 at the output of the quantizer 8, as shown in FIG. 8. To make the frequency resolution B2 to which the quantizer 8 is set M times the frequency resolution B1 for obtaining the desired detection frequency, a low-pass filter 10 may be provided that calculates a moving average of M data.

For example, if the frequency resolution B1 to obtain the desired detection precision is 0.09 (number of divisions N=1000), and the convergence value of the center frequency $f_c$ does not match the input frequency $f_{in}$, then the center frequency $f_c$ of the band-pass filter 2 takes on a state in which it oscillates at a pitch of 0.09 Hz around the input frequency $f_{in}$. On the other hand, if the frequency resolution B2 is set to 0.9 (number of divisions N=100), then the center frequency $f_c$ of the band-pass filter 2 takes on a state in which it oscillates at a pitch of 0.9 Hz around the input frequency $f_{in}$. That is to say, if the number of divisions N is 100, then the oscillation width in the converged state of the center frequency $f_{cj}[k]$ that is output by the quantizer 8 is about 10 times as large as in the case where the number of divisions N is 1000, and the detection precision drops to about 1/10.

By contrast, if the low-pass filter 10 calculating the moving average of 10 data points is arranged behind the quantizer 8, then the series of center frequencies $f_{cj}[k]$ output from the quantizer 8 is averaged in blocks of 10 by the low-pass filter 10, so that the oscillation width of the center frequency $f_{cj}[k]$ is suppressed. For example, if the center frequency $f_{cj}[k]$ output from the quantizer 8 oscillates around the input frequency $f_{in}$, then the average value of a block of 10 data points likely becomes substantially zero, so that the oscillation width becomes one order of magnitude smaller than in the case where no low-pass filter 10 is provided.

Consequently, if the number of divisions N for obtaining the desired detection precision is reduced to 1/M and a low-pass filter 10 that calculates the moving average of M data points is arranged behind the quantizer 8, then it is possible to reduce the number of coefficients $a_{1j}$ that need to be stored in the memory 7a and to reduce the memory capacity of the memory 7a, without reducing the precision with which the frequency is detected.

It should be noted that the first to third embodiments have been explained for the case that digital data $x[k]$ is input as the input signal $S_{in}$ into the signal detection apparatus 1, 1', 1", but in high-frequency power supply systems and distributed power sources to which the signal detection apparatus 1, 1', 1" is applied, the voltage signal of the load or the voltage signal of the electric system is detected by an analog signal, and this detection signal is input into the signal detection apparatus 1, 1', 1", so that an A/D converter converting this analog signal into a digital signal may be arranged at the input stage of the band-pass filter 2.

Moreover, when detecting the voltage signal of the electric system, there are cases where high-frequency components other than the base frequency $f_p$ (50 Hz or 60 Hz in Japan) are included in this detection signal, and if, in order to detect the voltage signal of the base frequency $f_p$, the center frequency $f_c$ of the band-pass filter 2 is subjected to a control that lets it converge to the base frequency $f_p$, then higher harmonic components may have an adverse influence. In order to detect a voltage signal of the n-order harmonic component, if a control is performed to let the center frequency $f_c$ of the band-pass filter 2 converge to the n-th order harmonic ($n \times f_p$), then an adverse influence is exerted on other harmonic components besides the n-th order harmonic component and on the base frequency component.

Moreover, there are cases where higher harmonic components besides the base frequency are included also in high-frequency power supply systems, and similar problems as described above may occur. Furthermore, there are cases where, in high-frequency power supply systems, a plurality of high-frequency powers of different frequencies are supplied at the same time to a load, and in such a case, in addition to the problems mentioned above, if the center frequency $f_c$ of the band-pass filter 2 is subjected to a control that lets it converge to the frequency of this high-frequency voltage, in order to detect one high-frequency voltage, then the problem may occur that frequencies and higher harmonic components of other high-frequency voltages exert an adverse influence on this control.

If an AC signal of unknown frequency or an AC signal with a frequency that changes over time is detected, then the AC signal detected by the sensor ordinarily includes higher harmonic components or signals of other frequencies other than the signal of the frequency that is to be detected. In order to prevent an adverse influence by these signals on the control for letting the center frequency $f_c$ of the band-pass filter 2 converge to the desired frequency, configurations as shown in FIGS. 9 to 11 are possible.

Figure 9:
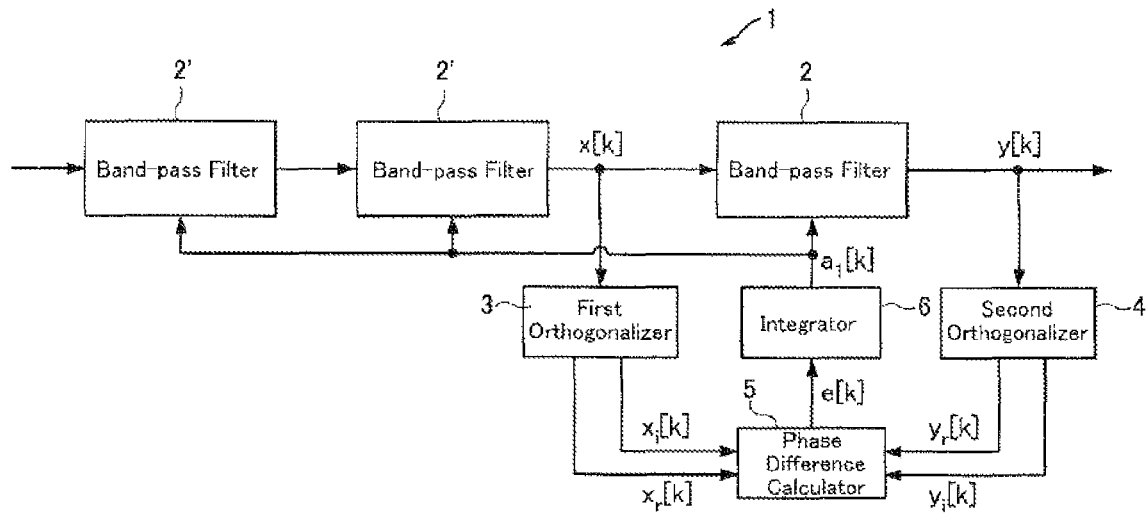
FIG. 9 is a block diagram showing the configuration of a modified example for reducing the adverse influence of higher harmonic components in a signal detection apparatus according to the first embodiment.
Figure 10:
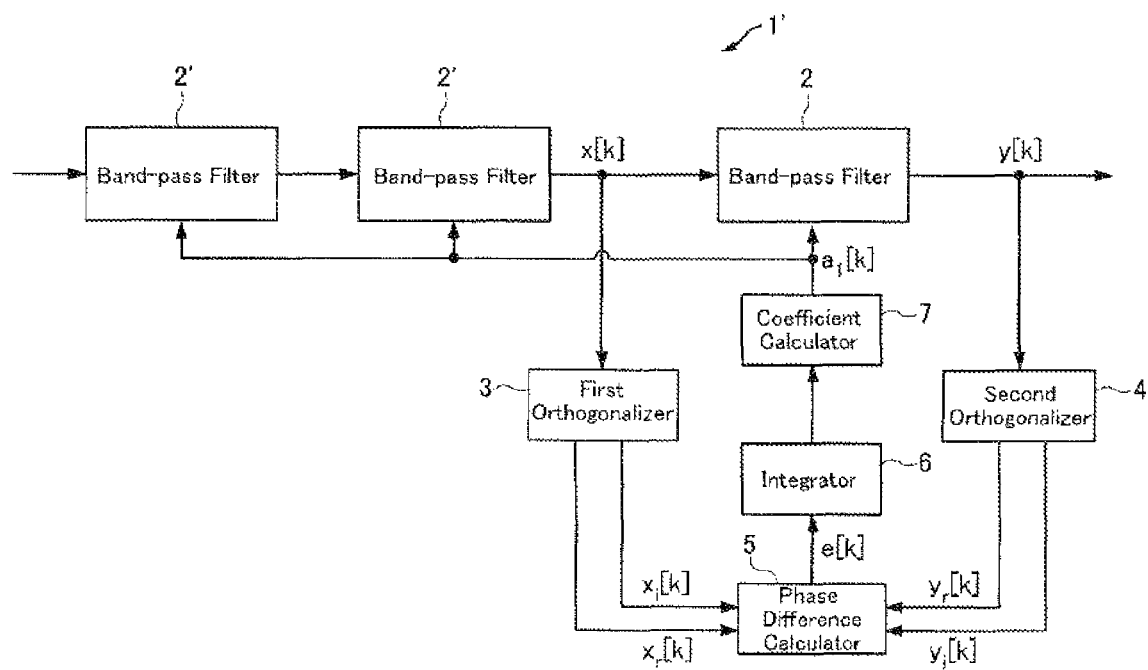
FIG. 10 is a block diagram showing the configuration of a modified example for reducing the adverse influence of higher harmonic components in a signal detection apparatus according to the second embodiment.
Figure 11:
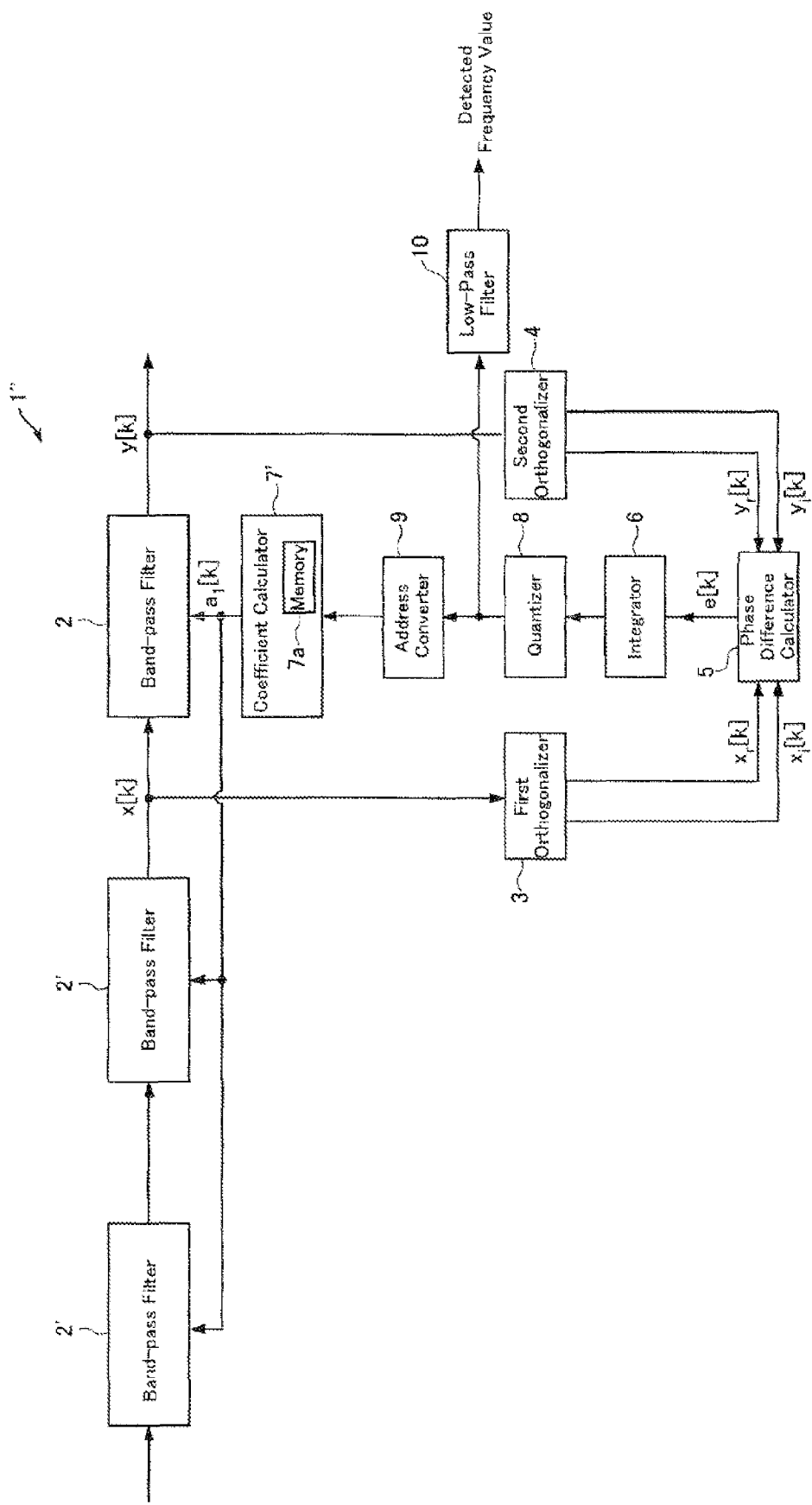
FIG. 11 is a block diagram showing the configuration of a modified example for reducing the adverse influence of higher harmonic components in a signal detection apparatus according to the third embodiment.

In the configurations shown in FIGS. 9 to 11, one or more band-pass filters 2' having the same transfer function H(z) as the band-pass filter 2 are cascaded in front of the band-pass filter 2, and the coefficient $a_1[k]$ that is output from the integrator 6 or the coefficient calculator 7, 7' is also fed back to the coefficient $a_1$ of the band-pass filters 2'.

The invention claimed is:

1. A signal detection apparatus, comprising:
   a band-pass filter made of a second-order IIR digital filter having a feedback calculation processing portion for performing a feedback calculation process that includes a process of multiplying a coefficient, the band-pass filter having phase characteristics that are negative in a frequency region larger than a center frequency, that are positive in a frequency region smaller than the center frequency, and that are zero at the center frequency, the center frequency changing when the coefficient changes;
   a first signal generator for generating, from an input signal that is input into the band-pass filter, an in-phase signal having the same phase as the input signal, and a quadrature phase signal having a phase that is orthogonal to the input signal;
   a second signal generator for generating, from an output signal that is output from the band-pass filter, an in-phase signal having the same phase as the output signal, and a quadrature phase signal having a phase that is orthogonal to the output signal;
   a phase difference information generator for generating information representing a phase difference between the input signal and the output signal, using the two signals generated by the first signal generator and the two signals generated by the second signal generator; and
   a coefficient controller for calculating, based on the information representing the phase difference, a control value that sustains the coefficient when the phase difference is zero, that reduces the coefficient when the phase difference is positive and that increases the coefficient when the phase difference is negative, and setting the coefficient of the band-pass filter with this control value.

2. The signal detection apparatus according to claim 1, wherein
   if the input signal is expressed by a first cosine signal and the output signal of the band-pass filter is expressed by a second cosine signal whose phase leads that of the first cosine signal, then
   the first signal generator generates a cosine signal having the same phase as the first cosine signal and a sine signal having the same phase as the first cosine signal;
   the second signal generator generates a cosine signal having the same phase as the second cosine signal and a sine signal having the same phase as the second cosine signal; and
   the phase difference information generator calculates a value that can be expressed as $M \cdot \sin(\phi)$ as the information representing the phase difference, where M is a constant, and $\phi$ is the phase difference between the first cosine signal and the second cosine signal.

3. The signal detection apparatus according to claim 1, wherein the coefficient controller is constituted by an integral calculator that inverts the sign of the information representing the phase difference and performs a predetermined integral calculation, and sets the coefficient of the band-pass filter with the calculated value as the control value.

4. The signal detection apparatus according to claim 1, wherein the coefficient includes a trigonometric function of the center frequency of the band-pass filter, and
the coefficient controller comprises:
   an integral calculator for performing a predetermined integral calculation on the information representing the phase difference; and
   a coefficient calculator for calculating the coefficient, taking the integral value calculated by the integral calculator as the center frequency of the band-pass filter, and setting the coefficient of the band-pass filter with the calculated value as the control value.

5. The signal detection apparatus according to claim 1, wherein the coefficient includes a trigonometric function of the center frequency of the band-pass filter, and
the coefficient controller comprises:
   an integral calculator for performing a predetermined integral calculation on the information representing the phase difference;
   a coefficient storage for storing a plurality of coefficients calculated in advance for each of a plurality of frequencies into which a predetermined frequency change range is quantized;
   a frequency converter for converting the integral value calculated by the integral calculator into a quantized frequency; and
   a coefficient setting unit for reading out, from the coefficient storage, a coefficient corresponding to the frequency into which the frequency converter has converted the integral value, and setting the coefficient of the band-pass filter with the read out frequency as a control value.

6. The signal detection apparatus according to claim 5, wherein data of the frequency that is output from the frequency converter is output after passing it through a low-pass filter that calculates a moving average of a predetermined number of data points.

7. The signal detection apparatus according to claim 1, wherein the band-pass filter has the following transfer function (Hz)

$$H(z) = \frac{b_0 + b_1 \cdot z^{-1}}{1 - a_1 \cdot z^{-1} - a_2 \cdot z^{-2}} \quad (1)$$

$$b_0 = 1 - r^2$$

$$b_1 = (r-1) \cdot 2r \cdot \cos(\theta_c) = (r-1) \cdot a_1$$

$$a_1 = 2r \cdot \cos(\theta_c)$$

$$a_2 = -r^2$$

r: parameter determining width of the pass-band and converging time
$f_c$: center frequency of the pass-band
$f_s$: sampling frequency,
and the coefficient is the coefficient $a_1$ of the transfer function H(z).

8. The signal detection apparatus according to claim 1, wherein at least one second band-pass filter having the same transfer function as the band-pass filter is cascaded in front of the band-pass filter, and the coefficient controller also sets the coefficient of the second band-pass filter with the control value.

\* \* \* \* \*